United States Patent
Yoda et al.

(10) Patent No.: US 6,909,130 B2
(45) Date of Patent: Jun. 21, 2005

(54) MAGNETIC RANDOM ACCESS MEMORY DEVICE HAVING HIGH-HEAT DISTURBANCE RESISTANCE AND HIGH WRITE EFFICIENCY

(75) Inventors: Hiroaki Yoda, Kawasaki (JP); Tomomasa Ueda, Yokohama (JP); Hisanori Aikawa, Yokohama (JP); Tatsuya Kishi, Yokohama (JP); Takeshi Kajiyama, Yokohama (JP); Yoshiaki Asao, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 41 days.

(21) Appl. No.: 10/704,552

(22) Filed: Nov. 12, 2003

(65) Prior Publication Data

US 2004/0195602 A1 Oct. 7, 2004

(30) Foreign Application Priority Data

Apr. 1, 2003 (JP) ........................................ 2003-098407

(51) Int. Cl.$^7$ ............................................... H01L 29/76
(52) U.S. Cl. ...................................... 257/295; 257/678
(58) Field of Search ................................. 257/295, 678, 257/528, 421, 422, 414, 298, 301

(56) References Cited

U.S. PATENT DOCUMENTS 5,940,319 A * 8/1999 Durlam et al. ............... 365/171

6,436,526 B1 * 8/2002 Odagawa et al. ........... 428/332

OTHER PUBLICATIONS

ISSCC Digest of Technical Papers, vol. 43, pp. 128–129, "TA 7.2 A 10NS Read and Write Non–Volatile Memory Array Using a Magnetic Tunnel Junction and FET Switch in Each Cell", Feb. 7–9, 2000.
U.S. Appl. No. 10/329,417, filed Dec. 27, 2002, Amano et al.
U.S. Appl. No. 10/345,253, filed Jan. 16, 2003, Saito et al.
U.S. Appl. No. 10/345,188, filed Jan. 16, 2003, Kishi et al.
U.S. Appl. No. 10/379,656, filed Mar. 6, 2003, Yoda et al.
U.S. Appl. No. 10/396,435, filed Mar. 26, 2003, Amano et al.
U.S. Appl. No. 10/704,552, filed Nov. 12, 2003, Yoda et al.
U.S. Appl. No. 10/715,545, filed Nov. 19, 2003, Saito et al.

* cited by examiner

*Primary Examiner*—David Nelms
*Assistant Examiner*—Thinh T Nguyen
(74) *Attorney, Agent, or Firm*—Oblon, Spivak, McClelland, Maier & Neustadt, P.C.

(57) ABSTRACT

A recording layer of an MTJ element is constituted by using a high crystal magnetic anisotropic material. A write wiring used to write data into the MTJ element is covered with a magnetic layer, and the write wiring and the magnetic layer are exchange-coupled with each other. A sum of a magnetic volume of the magnetic layer at a part opposed to the recording layer of the MTJ element and that of the recording layer is set smaller than a magnetic volume of the magnetic layer at any other part.

14 Claims, 10 Drawing Sheets

TO FIRST MRAM DATA REWRITE CONTROLLER

MAGNETIC RANDOM ACCESS MEMORY DEVICE HAVING HIGH-HEAT DISTURBANCE RESISTANCE AND HIGH WRITE EFFICIENCY

CROSS-REFERENCE TO RELATED APPLICATIONS

This application is based upon and claims the benefit of priority from the prior Japanese Patent Application No. 2003-98407, filed Apr. 1, 2003, the entire contents of which are incorporated herein by reference.

BACKGROUND OF THE INVENTION

1. Field of the Invention

The present invention relates to a magnetic random access memory (MRAM) device, and more particularly to a structure of a memory cell in an MRAM device using magnetic memory cells which store data by the tunneling magnetoresistive effect.

2. Description of the Related Art

In recent years, there have been proposed many memory devices which store information based on a new principle. As one of such memory device, an MRAM device having both the non-volatility and the rapidity in which a plurality of memory cells including magnetic tunnel junction elements (which will be referred to as MTJ elements hereinafter) having a tunneling magnetoresistive effect are arranged in a matrix form is disclosed in, e.g., Roy Scheuerlein et. al. "A 10 ns Read and Write Non-Volatile Memory Array Using a Magnetic Tunnel Junction and FET Switch in each Cell", ISSCC2000 Technical Digest pp. 128 to pp. 129.

The MTJ element has two magnetic layers which are generally referred as a recording layer and a fixed layer. When programming data in the MTJ element, a current is caused to flow through a write wiring, and a magnetic field in a predetermined direction is applied to the MTJ element, thereby changing the direction of magnetization of the recording layer.

Meanwhile, the most serious problem in the MRAM device is a reduction in a write current. The present inventors found that assuring a thermal stability of recorded information is an important problem as a result of an experiment of holding the reliability of the MTJ element. This prehistory will now be described hereinafter.

Under the present situation, a write current value of the MTJ element is as large as 8 to 10 mA. For a practical application, the write current value must be lowered to an allowable level. In the case of a test chip of the MRAM device on a 1K bit level manufactured by the present inventors by way of trial, the current write value is 8 to 10 mA as was expected.

Further, bit information retention characteristics of the MTJ element were examined. As a result, irrespective of a fact that criteria $Ku \times V/kB \times T$ of the thermal stability of the recorded information which are usually considered in a magnetic medium of a hard disk storage apparatus are set to be not less than 80, some bit information were reversed. Here, V is a cubic volume of a recording layer of the MTJ element, kB is the Boltzmann constant, and T is an absolute temperature. In case of the MRAM device, Ku is given mainly based on a shape magnetic anisotropy as a general rule, and it is actually a sum of an anisotropic energy and an induced magnetic anisotropy.

For improving the thermal stability of the recorded bit information in order to prevent the bit information from being switched, $Ku \times U$ is usually set large. By doing so, however, the write current is increased.

In the MRAM device, it is desirable to achieve both a reduction in the write current and an assurance of the thermal stability of the recorded information as described above. In the prior art, however, a concrete design plan for this purpose is not proposed. The prehistory that this problem was found will now be described in detail hereinafter.

At present, a reported write current value of the MTJ element is at least approximately 8 mA if a cell width is approximately 0.6 $\mu$m and a cell length is approximately 1.2 $\mu$m.

Usually, a shape of a flat surface of the MTJ element is determined as a rectangular or an ellipse, the shape magnetic anisotropy is given to the MTJ element, a direction of magnetization of the MTJ element is stipulated, and the thermal stability of the recorded information is also given.

$Ku \times V$ is a product of a sum of the shape magnetic anisotropy and the induced magnetic anisotropy of the MTJ element, and a volume of the recording layer of the MTJ element. Here, the induced magnetic anisotropy of the recording layer is given in the same direction as that of the anisotropy based on a shape so as not to generate the dispersion of the anisotropy or the like. However, usually, NiFe used as a material of the recording layer has the induced magnetic anisotropy (several Oe) smaller than the anisotropic magnetic field based on a shape by a single digit, and it is considered that the thermal stability of the recorded information and the switching magnetic field are also substantially determined by the shape magnetic anisotropy.

The switching magnetic field Hsw required to rewrite magnetization information of the recording layer is substantially given by the following expression (1).

$$Hsw = 4\pi \times Ms \times t/F (Oe) \quad (1)$$

Here, Ms is a saturation magnetization of the recording layer, t is a thickness of the recording layer, and F is a width of the recording layer. Further, a sum Ku of the anisotropic energy based on a shape and the induced magnetic anisotropy is substantially given by the following expression (2).

$$Ku = Hsw \times Ms/2 \quad (2)$$

As a method for reducing the write current, coating a conventional write wiring made of, e.g., Cu with a soft magnetic material such as NiFe and using it as a write wiring with a yoke is proposed in, e.g., Saied Tehrani, "Magneto resistive RAM", 2001 IEDM short course. According to this method, the approximately twofold high-efficiency effect, i.e., the write current value can be reduced to approximately ½.

FIG. 1 shows an example of a structure of the write wiring with a yoke described in the above cited reference ("Magneto resistive RAM"), and FIG. 2 shows a result of examining write characteristics obtained by using the write wiring illustrated in FIG. 1. As shown in FIG. 1, the write wiring with a yoke 10 has a structure that a part of the periphery of a write wiring 11 made of Cu is coated with a yoke 12 made of a soft magnetic material such as NiFe.

In FIG. 2, characteristics A indicated by a solid line show a state that a width F of a recording layer is reduced and a switching magnetic field Hsw is increased as minuteness of an MTJ element is realized when a CoFeNi thin film having a film thickness of 2 nm is used as the recording layer. It is to be noted that characteristics B show a generated magnetic field when a conventional write wiring without a yoke is used, and characteristics C show a generated magnetic field when a write wiring with a yoke is used.

In case of using the conventional write wiring (characteristics B), since the generated magnetic field is larger than the switching magnetic field until 1/F is approximately 7, writing is possible. On the other hand, in case of using the conventional write wiring with a yoke (characteristics C), since the generated magnetic field is larger than the switching magnetic field even if 1/F exceeds approximately 7, writing is possible, but the generated magnetic field is smaller than the switching magnetic field when 1/F exceeds approximately 10.

As a result of examining the case that write wiring with a yoke formed by a prior art is used based on an experiment and a computer simulation, the approximately twofold high-efficiency effect was confirmed, and the write current can be reduced to 5 mA. However, this is the limit, and it is far from 1 to 2 mA which is a target value required for a practical application.

Furthermore, as a result of performing writing at a high speed by using a write current with a short pulse width of approximately 50 nsec, irregularities are generated in the required write current value, there is acquired only the reproducibility which is far below the reproducibility 90% obtained when writing is performed with a fixed write current.

On the other hand, even if Ku×V/kB×T of the recording layer is set to be not less than 80, some bit information is reversed. Although a cause is uncertain, the thermal stability of the recorded information is not determined by Ku×V, particles constituting the recording layer in a given defective cell undergo the thermal disturbance, i.e., Kcrysta×Vgrain (Kcrysta is a crystal magnetic anisotropy of a recording layer material, and Vgrain is a cubic volume of particles constituting the recording layer), and this becomes a factor of switching of the magnetization information of the cell. That is, it can be considered that there is a cell that Kcry×v (Kcry is a crystal magnetic anisotropic energy, and v is a cubic volume of one particle) determines the thermal stability of the recorded information.

FIG. 3 shows an example of an arrangement relationship between the conventional write wiring with a yoke and the MTJ element.

The write wiring with a yoke 10 has a structure that three surfaces of the write wiring 11, i.e., a bottom surface and both side surfaces are covered with a yoke 12 made of a magnetic material such as NiFe. Such a write wiring with a yoke 10 can generate a large magnetic field by using the same write current as compared with the regular write wiring without a yoke.

An MTJ element 20 has a structure that a non-magnetic layer 23 is sandwiched between a recording layer 21 and a fixed layer 22 each made of a magnetic layer. The fixed layer 22 is connected to a bit line (BL) 24.

FIG. 4 shows an example of a relationship between a distance from a yoke edge and a generated magnetic field when the write current is caused to flow through the write wiring 10 with the yoke depicted in FIG. 3. According to this magnetic field distribution, a certain degree of a large magnetic field is generated in the vicinity of the yoke edge. However, as distanced from the yoke edge, the magnetic field suddenly becomes small.

In order to solve such a problem, although using a material having a high crystal magnetic anisotropy in the recording layer was tried, it was revealed that the good outcome cannot be obtained by only using this material as a result of the experiment.

First, as the recording layer 21 in which information is written by the write wiring with the yoke 10 depicted in FIG. 3, a use of a soft magnetic material such as NiFe having the crystal magnetic anisotropy of approximately $10^3$ erg/cc can be considered. In this case, a magnetic flux in the vicinity of the yoke edge is led to a central portion of the recording layer 21 by NiFe, and a large magnetic flux is led even to the center of the recording layer 21. In an experimental result, a magnetization direction in the recording layer 21 was able to be switched with a small write current value of approximately 2 mA. This can be considered because NiFe has a high magnetic permeability. It is to be noted that the shape magnetic anisotropy is approximately $10^4$ erg/cc in this case.

However, as a result of examining data retention characteristics of the recording layer 21, a cell whose magnetization direction is switched was found, and it was revealed that there is a cell that the data retention characteristics of approximately 10 years cannot be expected. That can be considered because the magnetization direction of the recording layer 21 is switched due to reversal of the magnetization direction of magnetic material particles (NiFe particles) 31 at a less yoked cell central portion (central portion of the recording layer 21) from the shape anisotropy by the thermal disturbance, as shown in FIG. 5.

Thus, as the recording layer 21 in which information is written by the write wiring with the yoke 10 depicted in FIG. 3, a use of, e.g., a Co-based magnetic material having a larger crystal magnetic anisotropy can be considered. As a result of performing an experiment about a use of, e.g., CoNiFe having both the shape magnetic anisotropy and the crystal magnetic anisotropy being approximately $10^4$ erg/cc as a material of the recording layer 21, the write current value used to switch the magnetization direction became as large as 15 mA, irregularities occurred in the write current for each cell, and the largest write current value exceeded 40 mA.

When CoNiFe was used, it was predicted that the write current value becomes approximately twofold of that when a NiFe-based material was used. However, the 7.5-fold write current is actually required as an average value, and a result was far from a reduction in the write current.

Moreover, since the magnetic flux in the vicinity of the yoke edge cannot be led to the center of the recording layer and the magnetization direction of the recording layer cannot be switched even if the magnetic field of the yoke edge is the same, a very large write current is required. That can be considered because the magnetic permeability of the Co-based material is not high. Additionally, as shown in FIG. 6, since irregularities are generated in directions of a crystal 32 of CoNiFe, i.e., since the crystal magnetic anisotropy due to a difference in crystal orientation in a film plane generates irregularities in intensity of the switching magnetic field for each cell in case of the Co-based material, it is estimated that great irregularities occur in the write current value for each cell.

Specifically, although the magnetic material is crystal-orientated in the vertical direction relative to the film plane, it cannot help becoming irregular in the film plane, and the crystal magnetic anisotropy competes with the shape magnetic anisotropy or the induced magnetic anisotropy given in a fixed direction of the recording layer. It is to be noted that an arrow in FIG. 6 indicates a direction of the shape magnetic anisotropy.

There are a cell that a direction of the shape magnetic anisotropy or the induced magnetic anisotropy and a direction of a crystal magnetic anisotropy are relatively aligned and a cell that such directions are not aligned, which becomes a factor of irregularities in the switching magnetic field for each cell. In particular, when a size of a cell is approximately 0.1 μm, the number of particles of the recording layer constituting one cell is approximately 10, which results in a further serious problem. It is to be noted that such a phenomenon is not observed in a NiFe-based material with the small crystal magnetic anisotropy, and hence no problem occurs.

To sum up, in order to assure the thermal stability of the recorded information, if the idea of using a material with the high crystal magnetic anisotropy to the recording layer is actually applied to the MRAM device, the write current value becomes large beyond expectation, and large irregularities are generated in the switching magnetic field. Therefore, there is demanded an MRAM device which can achieve both a reduction in the write current value and an assurance of the thermal stability of bit information, and has the high thermal stability and the high write efficiency.

BRIEF SUMMARY OF THE INVENTION

According to an aspect of the present invention, there is provided a magnetic random access memory device comprises: a magnetoresistive element which stores data in accordance with a size of a resistance value between first and second magnetic layers which varies in response to magnetization arrangement states of the first and second magnetic layers, a non-magnetic layer being sandwiched between the first and second magnetic layers; a write wiring which is arranged in the vicinity of the first magnetic layer, generates an induced magnetic flux when a write current flows therethrough, and writes data in the magnetoresistive element by changing a magnetization direction in the first magnetic layer when the induced magnetic flux is applied to the magnetoresistive element; and a third magnetic layer provided so as to cover at least a peripheral surface of the write wiring including a first part of the write wiring opposed to the first magnetic layer in the peripheral surfaces of the write wiring, wherein the first magnetic layer has a crystal magnetic anisotropy exceeding $10^4$ erg/cc, the first magnetic layer is exchange-coupled with the third magnetic layer, and a sum of a magnetic volume of a second part of the third magnetic layer opposed to the first part of the write wiring and that of the first magnetic layer is smaller than a magnetic volume of the third magnetic layer at parts other than the second part.

DETAILED DESCRIPTION OF THE INVENTION

Figure 7:
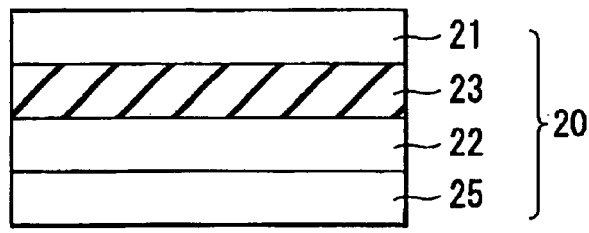
FIG. 7 is a cross-sectional view schematically showing a general structure of the MTJ element used in an MRAM device.

Before explaining embodiments according to the present invention, an MTJ element used in an MRAM device according to the embodiments of the present invention will be first described. FIG. 7 schematically shows a cross-sectional structure of the MTJ element.

The MTJ element 20 has a structure in which one non-magnetic layer (tunnel barrier film) 23 is sandwiched between two magnetic layers 21 and 22 each made of a ferromagnetic layer or a ferromagnetic material film. The MTJ element stores a logic "1" level data or level "0" data depending on whether directions of magnetization of the two magnetic layers 21 and 22 are parallel or anti-parallel.

An anti-ferromagnetic layer 25 is arranged on the magnetic layer 22. The anti-ferromagnetic layer 25 is a member used to change only a direction of magnetization of the magnetic layer 21 by fixing a direction of magnetization of the magnetic layer 22, and thereby readily rewrite data. Here, the magnetic layer 22 whose direction of magnetization is fixed is referred to as a fixed layer or a pinned layer, and the magnetic layer 21 whose direction of magnetization is variable is referred to as a free layer or a recording layer.

Figure 8A:
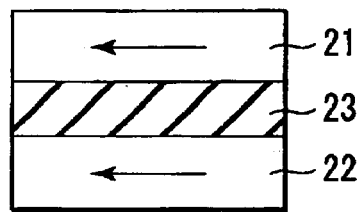
FIGS. 8A and 8B are views showing directions of magnetization of two magnetic layers in the MTJ element depicted in FIG. 7.
Figure 8B:
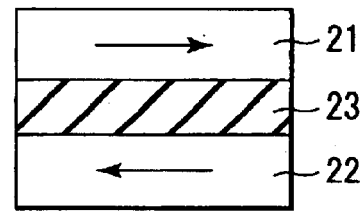

FIGS. 8A and 8B show two states of directions of magnetization of the two magnetic layers 21 and 22 of the MTJ element 20 depicted in FIG. 7.

As shown in FIG. 8A, when the directions (directions of arrows in the drawing) of magnetization of the two magnetic layers 21 and 22 are parallel (same), a tunnel resistance of the tunnel barrier film 23 sandwiched between the two magnetic layers 21 and 22 is lowest. In this case, a tunnel current is largest.

As shown in FIG. 8B, when the directions of magnetization of the two magnetic layers 21 and 22 are anti-parallel, the tunnel resistance of the tunnel barrier film 23 sandwiched between the two magnetic layers 21 and 22 is highest. In this case, the tunnel current becomes minimum.

In the MRAM device, the two states that the MTJ elements have different resistance values are associated with a data storage state on the logic "1" level (state "1") and a data storage state on the logic "0" level (state "0").

Figure 9:
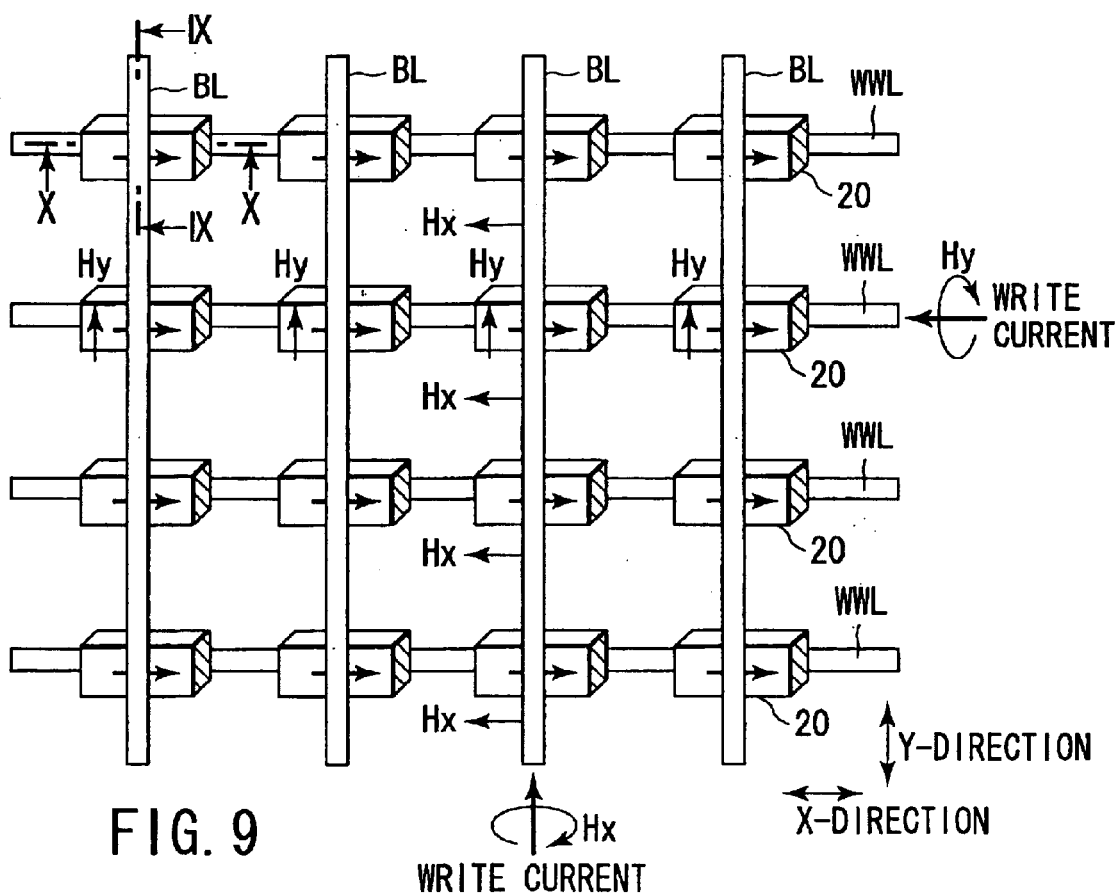
FIG. 9 is a view typically showing an example of a plane layout of a cell array of the MRAM device.

FIG. 9 typically shows an example of a plane layout of a cell array of the MRAM device constituted by two-dimensionally arranging a plurality of MTJ elements in a row direction and a column direction.

Figure 1:
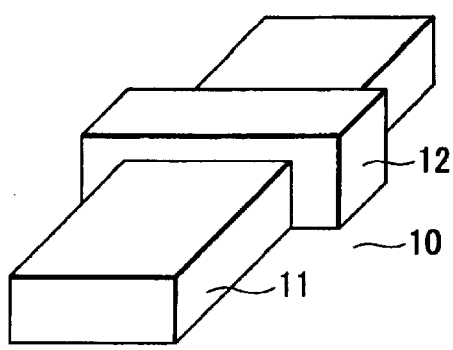
FIG. 1 is a perspective view showing an example of a structure of a conventional write wiring with a yoke.

A plurality of write/read bit lines BL and a plurality of write word lines WWL are arranged in directions orthogonal to each other. Further, each MTJ element 20 is arranged in accordance with an intersection between each bit line BL and each write word line WWL. To each MTJ element 20 is given a magnetization direction along a direction of a long side of a rectangular in such a manner that the long side of the rectangular is parallel with the write word line WWL and a short side of the same is parallel with the bit line BL. Each bit line BL is electrically connected to one magnetic layer (reference numeral 21 or 22 in FIG. 7) of each of a plurality of the MTJ elements 20 in the same row (or column). Each write word line WWL is arranged so as to be opposed to the other magnetic layer (reference numeral 22 or 21 in FIG. 1) of each of a plurality of the MTJ elements in the same column (or row) in close proximity.

Figure 10:
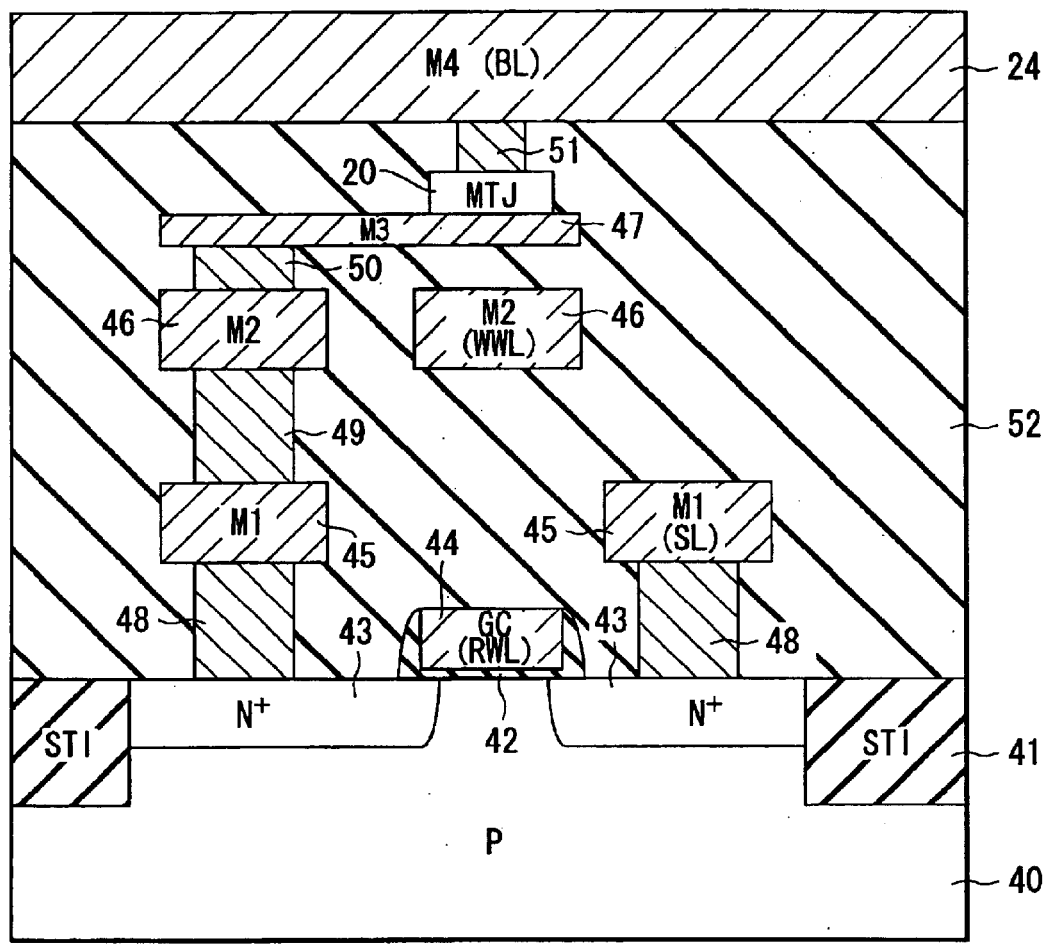
FIG. 10 is a cross-sectional view taken along the line IX—IX in FIG. 9.
Figure 11:
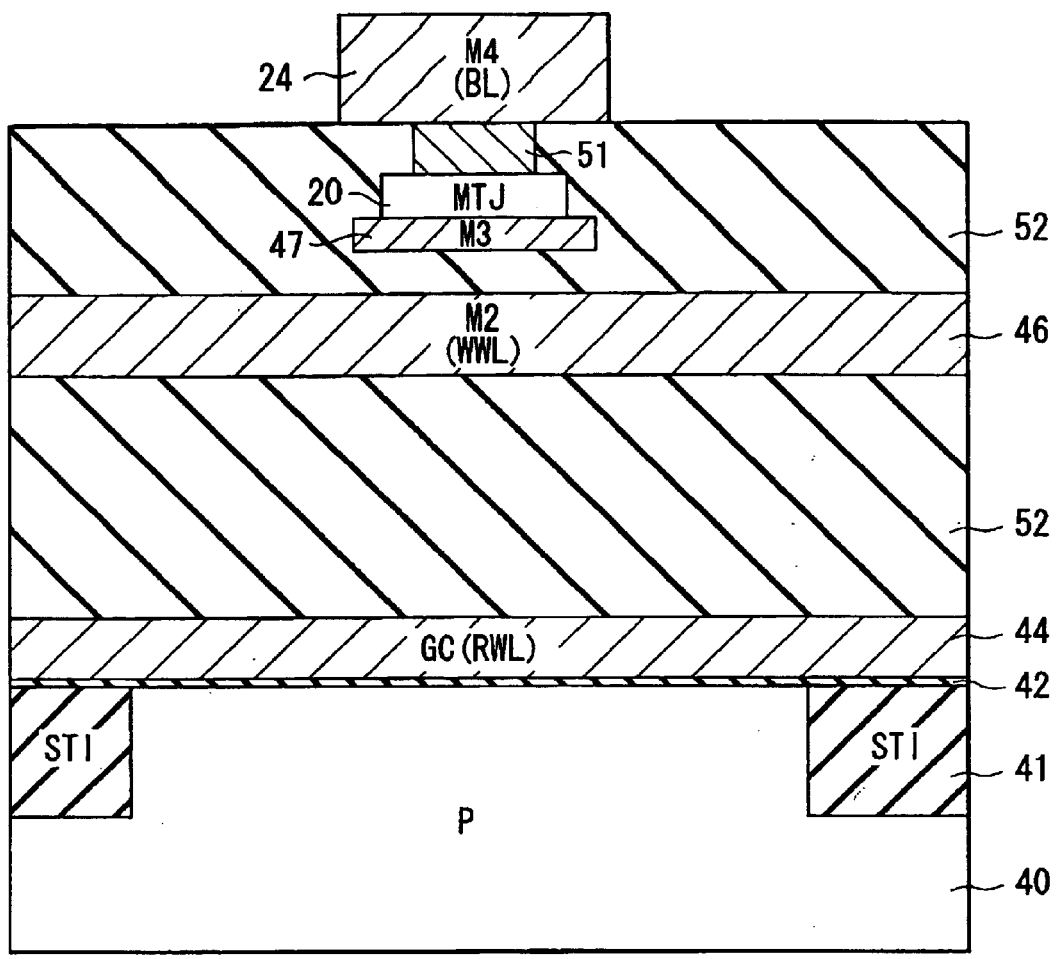
FIG. 11 is a cross-sectional view taken along the line X—X depicted in FIG. 9.

FIGS. 10 and 11 show cross-sectional structures in different directions when attention is paid to one memory cell in cases where a memory cell is constituted by connecting an NMOSFET as a read cell selection switch element to each MTJ element 20 depicted in FIG. 9.

In FIGS. 10 and 11, reference numeral 40 denotes a semiconductor substrate (e.g., a P-type Si substrate); 41, a shallow trench type isolation region (STI); 42, a gate oxide film; 43, an impurity diffusion region ($N^+$) as a drain or a source region of a read cell selection transistor (NMOSFET); 44, a gate electrode (GC); 45, a first metal wiring layer (M1); 46, a second metal wiring layer (M2); 47, an MTJ connection wiring made of a third metal wiring layer (M3); 48, an electro-conductive contact used to electrically connect the first metal wiring layer 45 to the diffusion layer 43; 49, a contact used to electrically connect the second metal wiring layer 46 to the first metal wiring layer 45; 50, a contact used to electrically connect the third metal wiring layer 47 to the second metal wiring layer 46; 20, an MTJ element; 24, a fourth wiring layer (M4); 51, a contact used to electrically connect the fourth metal wiring layer 24 to the MTJ element 20; and 52, an interlayer insulating film.

It is to be noted that BL denotes a write/read bit line; WWL, a write word line; SL, a source line; and RWL, a read word line as use application of wirings, and the source line SL is connected to a ground potential.

An operation principle of the MTJ element will now be described with reference to FIGS. 9 to 11.

Writing with respect to the MTJ element 20 is carried out by causing a current to flow through the write word line WWL and the bit line BL and setting a direction of magnetization of the MTJ element 20 to be parallel or anti-parallel by using a combined magnetic field formed by currents flowing through the both wirings.

That is, when writing data to the MTJ element 20, a magnetic field Hx is generated by causing a current set to a first direction or a second direction opposite to the first direction to flow through the bit line BL in accordance with data, and a magnetic field Hy is generated by causing only a current set to a fixed direction to flow through the write word line WWL, thereby writing information by using the combined magnetic field. At this time, when the current set to the first direction is caused to flow through the bit line BL, the direction of magnetization of the MTJ element 20 becomes parallel. When the current set to the second direction is caused to flow through the bit line BL, the direction of magnetization of the MTJ element 20 becomes anti-parallel.

When reading data from the MTJ element 20, the read word line RWL is activated, the NMOSFET in FIG. 10 connected to a selected MTJ element 20 is turned on in order to make a current path, and the current is caused to flow through the source line SL from the selected bit line BL. As a result, since the current according to its resistance value of the selected MTJ element 20 flows through only the selected MTJ element 20, data can be read by detecting its current value.

A mechanism that the direction of magnetization of the MTJ element is changed will now be briefly described with reference to FIGS. 12 and 13.

Figure 12:
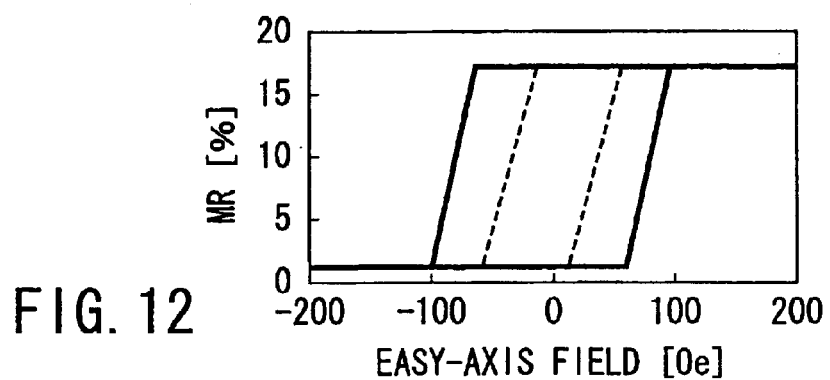
FIG. 12 is a TMR characteristic curve of the MTJ element depicted in FIG. 7.

FIG. 12 shows TMR characteristics curve of the magnetic field applied to the MTJ element and the resistance value of the MTJ element. FIG. 13 shows an asteroid curve of the MTJ element.

Like the TMR curve depicted in FIG. 12, when the magnetic field Hx is applied in an easy-axis direction of the MTJ element, the resistance value of the MTJ element is changed, e.g., approximately 17%. This change ratio, i.e., a ratio of the resistances difference between two states and parallel state resistance is referred to as an MR ratio. It is to be noted that the MR ratio varies depending on properties of the magnetic layers of the MTJ element. At present, an MTJ element having the MR ratio of approximately 50% is available. The MTJ element is subjected to a magnetic field obtained by combining the magnetic field Hx in the easy-axis direction and a magnetic field Hy in a hard-axis direction.

As indicated by solid lines and broken lines in FIG. 12, the intensity of the magnetic field Hx in the easy-axis direction required to change the resistance value of the MTJ element also varies depending on the intensity of the magnetic field Hy in the hard-axis direction. Utilizing this phenomenon can write data only in the MTJ element arranged in accordance with an intersection of a selected write word line WWL and a selected bit line BL in a plurality of memory cells arranged in an array form.

Figure 13:
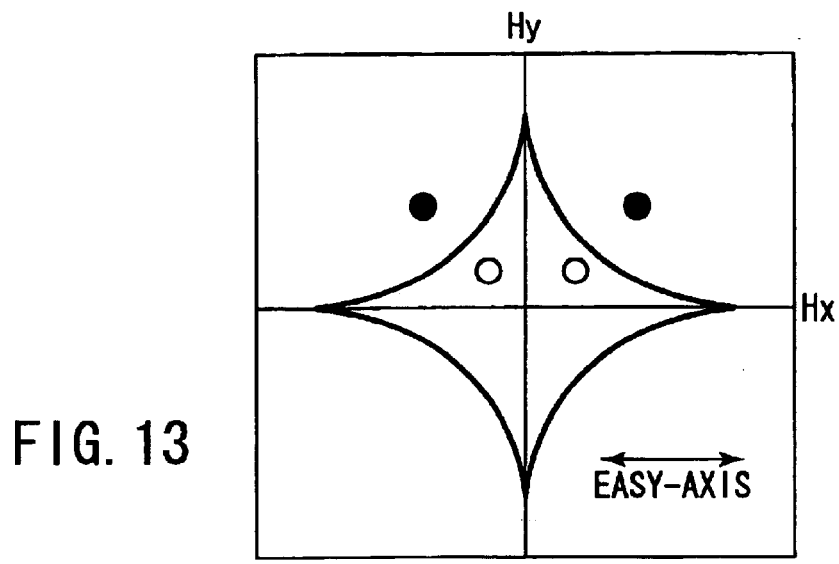
FIG. 13 is a characteristic view showing an asteroid curve of the MTJ element depicted in FIG. 7.

That is, as shown in FIG. 13, if the intensity of the combined magnetic field obtained by combining the magnetic field Hx in the easy-axis direction and the magnetic field Hy in the hard-axis direction corresponds to the outside of the asteroid curve, e.g., positions of black circles in the drawing, the directions of magnetization of the magnetic layers of the MTJ element can be switched. That is, data can be written.

On the contrary, if the intensity of the combined magnetic field obtained by combining the magnetic field Hx in the easy-axis direction and the magnetic field Hy in the hard-axis direction corresponds to the inside of the asteroid curve, e.g., positions of write circles in the drawing, the directions of magnetization of the magnetic layers of the MTJ element cannot be switched. That is, data cannot be written.

Therefore, changing the intensity of the combined magnetic field obtained by combining the magnetic field Hx in the easy-axis direction and the magnetic field Hy in the hard-axis direction and changing a position of the combined magnetic field in an Hx-Hy plane can control writing of data with respect to the MTJ element.

Furthermore, when to the MTJ element is applied the magnetic field Hx only in the easy-axis direction, i.e., the magnetic field Hx obtained by only the current flowing through the write word line or the magnetic field Hy only in the hard-axis direction, i.e., the magnetic field Hx obtained by only the current flowing through the write bit line, since the combined magnetic field does not protrude to the outside of the asteroid curve, data cannot be written.

As to the write operation in the MRAM device, always correctly writing the write data to the MTJ element, i.e., stabilization of the write characteristics is required. Stabilization of the write characteristics is particularly important when stored data in the MTJ element is different from the write data. In such a case, the magnetization direction of the recording layer of the MTJ element must be stably reversed.

(First Embodiment)

Figure 14:
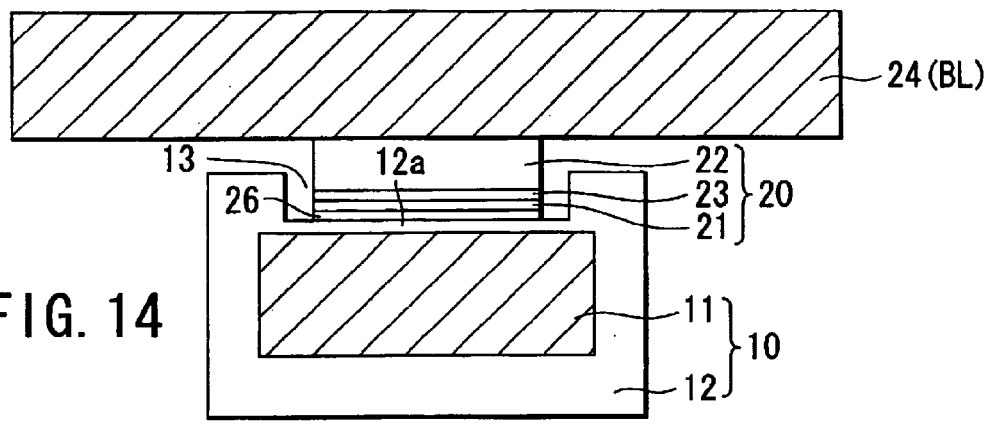
FIG. 14 is a cross-sectional view typically showing a memory cell used in an MRAM device according to a first embodiment of the present invention.

FIG. 14 is a cross-sectional view typically showing an arrangement relationship between the MTJ element, the write wiring and the bit line in connection with an example of the memory cell used in an MRAM device according to a first embodiment of the present invention.

Figure 3:
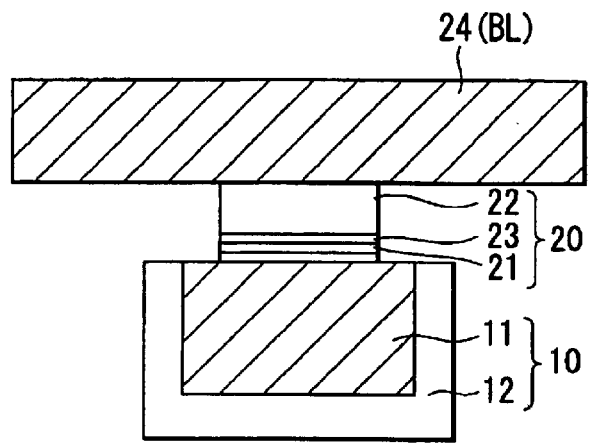
FIG. 3 is a perspective view showing a conventional MTJ element having the write wiring with a yoke.
Figure 2:
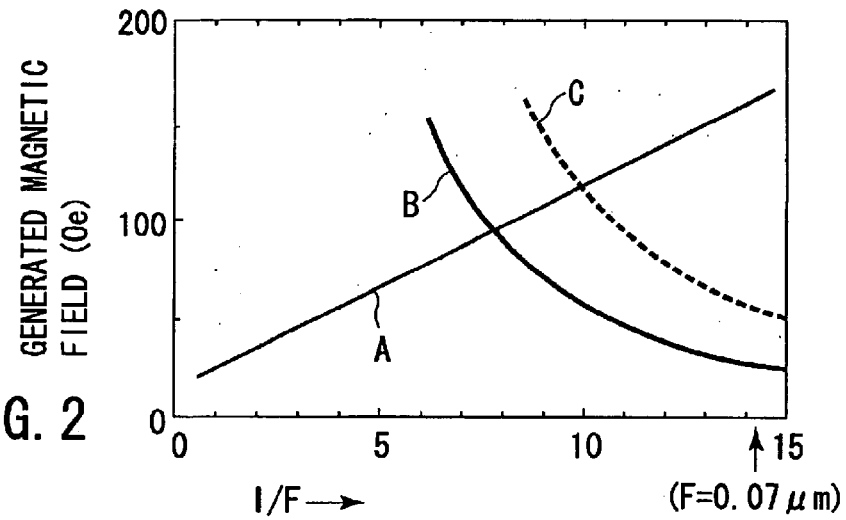
FIG. 2 is a characteristic view showing write characteristics of a cell using the write wiring with a yoke depicted in FIG. 1.
Figure 4:
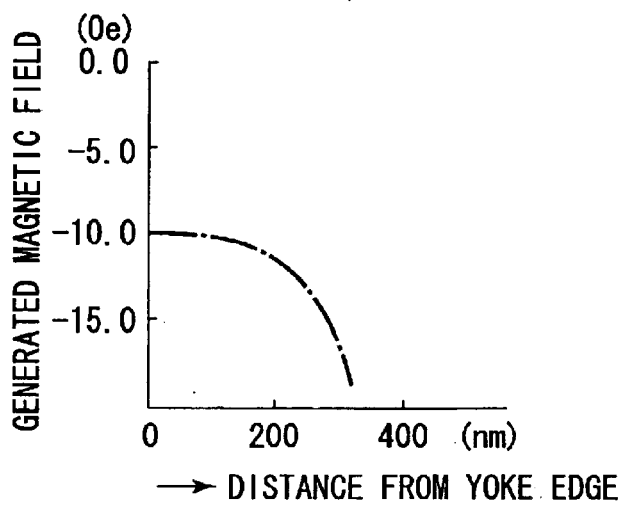
FIG. 4 is a view showing an example of a magnetic field distribution generated by the write wiring with a yoke depicted in FIG. 3.
Figure 5:
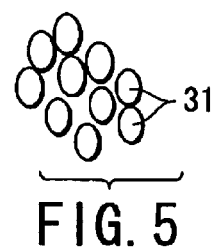
FIG. 5 is a view showing a state of magnetic material particles when NiFe is used as a recording layer of the MTJ element depicted in FIG. 3.
Figure 6:
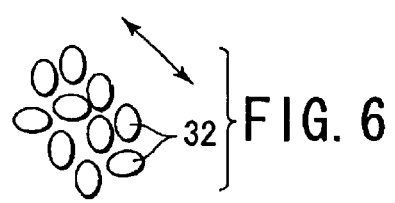
FIG. 6 is a view showing a state of a crystal when CoNiFe is used as the recording layer of the MTJ element depicted in FIG. 3.

In FIG. 14, the MTJ element 20 is the same as the MTJ element described in conjunction with FIG. 3 in that the tunnel magnetoresistive effect is provided by the structure that the tunnel barrier layer 23 is sandwiched between the recording layer 21 and the fixed layer 22 each made of a magnetic film, but different from that shown in FIG. 3 in the following point.

As the recording layer 21, there is used a material with a high magnetic anisotropy that a crystal magnetic anisotropy exceeds $10^4$ erg/cc, e.g., a Co-based material such as CoFeNi, CoFe, CoCr, CoPt and others (characteristics 1).

A laminated film made of, e.g., PtMn and CoFe is used as the fixed layer 22 of the MTJ element 20 and, e.g., AlOx is used as the tunnel barrier layer 23. The MTJ element 20 according to this example has a rectangular or elliptic shape and is arranged in such a manner its long side direction is parallel to the write wiring 10, and a direction of magnetization is given along the long side direction.

As the write wiring 10, there is used a write wiring with a yoke that at least one surface opposed to the MTJ element 20, or all four surfaces in this example, of peripheral surfaces of a regular write wiring 11 made of, e.g., Cu is covered with a magnetic layer 12 made of a magnetic material such as NiFe or CoZrNb.

A recording layer 21 of the MTJ element 20 is superimposed on a part of the magnetic layer 12 of the write wiring with a yoke 10 through, e.g., a ruthenium (Ru) film 26. Magnetic particles constituting the recording layer 21 of the MTJ element 20 are exchange-coupled with the magnetic layer 12 of the write wiring with a yoke 10. This exchange coupling may be either ferro-coupling or anti-ferro-coupling. Alternatively, it may be 90-degree coupling.

In this example, the magnetic layer 12 covering the peripheral surface of the write wiring with a yoke 10 opposed to the MTJ element 20 has a concave cross section, and a lower portion of the MTJ element 20 or at least the recording layer 21 is provided in the concave portion 13. In other words, a part 12a of the magnetic layer 12 which is opposed to the recording layer 21 is formed thinner than a thickness of any other part, and a part of the magnetic layer 12 exists so as to be opposed to both ends of the recording layer 21 of the MTJ element 20 in a widthwise direction of the write wiring 10, i.e., a direction crossing the extending direction of the write wiring 10 (characteristics 3).

Incidentally, it is good enough for the magnetic layer 12 to have a shape that the magnetic flux converges toward the MTJ element 20, and this shape can be modified in many ways. Furthermore, the magnetic layer 12 has the larger magnetic permeability than that of the recording layer 21. Moreover, the magnetic layer 12 has a higher saturation magnetic flux density than that of the recording layer 21.

Moreover, a sum of magnetic volumes (Ms×t) of the part 12a of the magnetic layer 12 at a portion where the MTJ element 20 is superimposed on the write wiring with a yoke 10 and of the recording layer 21 is set smaller than a magnetic volume (Mx'×t') of the magnetic layer 12 at any other portion. In this case, it is desirable to set the volume ratio (Ms×t/Ms'×t') smaller than 0.9, or preferably smaller than 0.3 (characteristics 4).

According to the structure shown in FIG. 14, the Ru film 26 is interposed and superimposed between the magnetic layer 12 on the top face of the write wiring with a yoke 10 and the recording layer 21 of the MTJ element 20. Therefore, the flatness of the superimposed surface is improved, and a magnitude of exchange coupling of the recording layer 21 and the magnetic layer 12 can be controlled by controlling a thickness of the Ru film 26.

In case of constituting the cell array by arranging the memory cells having the above-described structure on a semiconductor layer, e.g., an Si substrate in a matrix form, the cell array is configured as described above in conjunction with FIGS. 9 to 11, the write wirings WWL are extended in the row direction so as to get closer to respective free layers 22 of the MTJ elements 20 in the same row on the lower layer side of the MTJ elements 20, and the bit lines BL are extended in the column direction so as to be continuous with the recording layers 21 of the MTJ elements 20 in the same column on the upper layer side of the MTJ elements 20.

A principle of the write operation with respect to the memory cell having the above structure will now be described.

Writing data to the MTJ element 20 can be achieved by causing a current proceeding in a first direction or a second direction opposite to the first direction according to write data to flow through the write wiring 10, and making a direction of magnetization of the recording layer 21 of the MTJ element 20 parallel or anti-parallel by using a magnetic field formed by this current.

It is to be noted that the magnetization direction of the recording layer 21 can be slightly inclined in writing by causing the current in a fixed direction to flow through the bit line BL as an auxiliary write current in writing. Therefore, as described in conjunction with the prior art, the write current is further reduced by making the direction of magnetization of the recording layer 21 parallel or anti-parallel by using a combined magnetic filed of magnetic parallel fields respectively formed by the currents flowing through the write wiring 10 and the bit line BL.

In case of reading data from the MTJ element 20, a path through which the current is passed to the selected MTJ element 20 from the selected bit line BL is formed, a current according to a resistance value of the MTJ element 20 is caused to flow, and a current value is detected by using a sense amplifier connected to the bit line BL, thereby reading data.

In the writing operation, the magnetic flux of the yoke is converged to the part 12a of the magnetic layer 12 on which the MTJ element 20 is superimposed and the recording layer 21 based on the structural characteristics (1) to (3). Since a magnetic leakage flux from the yoke edge also flows to the recording layer 21, the write current is greatly reduced. Furthermore, since the recording layer 21 is exchange-coupled with the magnetic layer 12 of the write wiring 10 having a yoke, differences in crystal orientations can be averaged, and irregularities in write current value can be greatly reduced. Moreover, it was confirmed that the write current value can be decreased to approximately 0.2 mA based on the characteristics (4).

Therefore, according to the first embodiment, it is possible to realize the MRAM device which can reduce the write current value to a practical level, eliminate irregularities in switching current value, assure the sufficient thermal stability of the recorded information, and decrease the write current value.

The advantage of the first embodiment will now be concretely described hereinafter.

First, the structural characteristics (1) were adopted, and the MTJ element 20 having the recording layer 21 made of a high magnetic anisotropic material of not less than $10^4$ erg/cc was arranged in close proximity to the write wiring with a yoke 10 covered with the magnetic layer 12. As a result of conducting an experiment with respect to such a memory cell, no switched cell was generated even though a shelf test was carried out.

Additionally, the structural characteristics (2) were adopted, the MTJ element 20 was superimposed on the part 12a of the magnetic layer 12 of the write wiring with a yoke 10, and the recording layer 21 was exchange-coupled with the magnetic layer 12 of the write wiring with a yoke 10. As a resulting of conducting an experiment with respect to such a memory cell, the write current value was approximately 1 mA, irregularities in the write current values were almost eliminated, and the maximum write current was reduced to 1.2 mA.

Further, the structural characteristics (3) were adopted, and a sum (Ms×t) of a magnetic volume of the part 12a of the magnetic layer 12 on which the MTJ element 20 is superimposed and that of the recording layer 21 was set smaller than a magnetic volume (Ms'×t') of any other part of the magnetic layer 12. Concretely, a magnetic volume ratio (Ms×t/Ms'×t') was set smaller than 0.3 (characteristics 4). As a result of conducting an experiment with respect to such a memory cell, the write current value was reduced to be not more than 0.5 mA as shown in FIG. 15.

Figure 15:
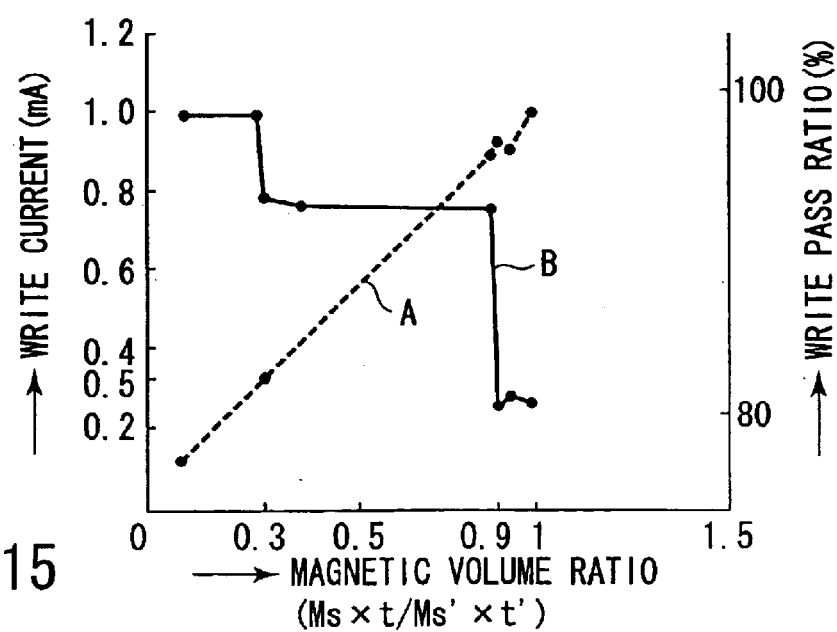
FIG. 15 is a characteristic view showing a relationship between a magnetic volume ratio of the MRAM device according to the first embodiment, an intensity of a write current and a write pass ratio.

FIG. 15 is a characteristic view showing a relationship between the magnetic volume ratio (Ms×t/Ms'×t') in the memory cell having the structure depicted in FIG. 14, the write current (characteristics A) and a write pass ratio (characteristics B).

It can be understood from this characteristic view that the write current becomes approximately 0.5 mA when the magnetic volume ratio (Ms×t/Ms'×t') is approximately 0.3, and the write pass ratio becomes maximum when the magnetic volume ratio is not more than approximately 0.3. Furthermore, even if the magnetic volume ratio substantially exceeds 0.3, the write current reduction effect can be provided, but irregularities in the write current were as large as approximately 0.5 mA. Even if the magnetic volume ratio substantially exceeds 0.3, the write pass ratio is not less than 80% in an area that the magnetic volume ratio is not more than approximately 0.9.

(Second Embodiment)

Figure 16:
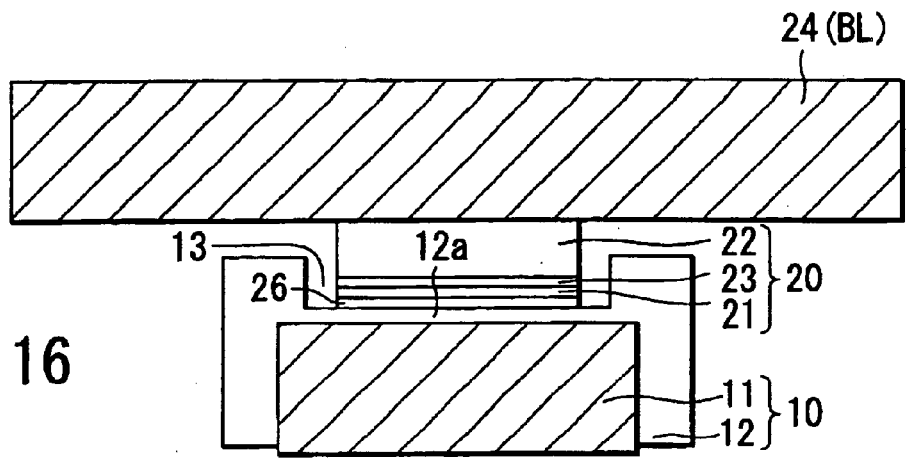
FIG. 16 is a cross-sectional view typically showing a memory cell of an MRAM device according to a second embodiment of the present invention.

FIG. 16 is a cross-sectional view typically showing a structure of an example of a memory cell used in an MRAM device according to a second embodiment of the present invention.

This memory cell is different from the memory cell according to the first embodiment in that peripheral surfaces of the write wiring with a yoke 10 which are opposite to a peripheral surface of the same opposed to the MTJ element 20 among four peripheral surfaces of the write wiring with a yoke 10, i.e., three peripheral surfaces other than a bottom surface in this example are covered with the magnetic layer 12, namely, a yoke of the bottom surface portion is eliminated, and any other part is the same, thereby eliminating the redundant explanation.

According to such a structure, since the yoke (magnetic layer 12) at the bottom surface portion of the write wiring 10 is eliminated, the write current becomes slightly bigger than that shown in FIG. 15. However, the MRAM device having such a structure is preferable when there is an enough cell array area. Furthermore, the MRAM device according to the second embodiment can reduce the number of steps in manufacture.

(Third Embodiment)

Figure 17:
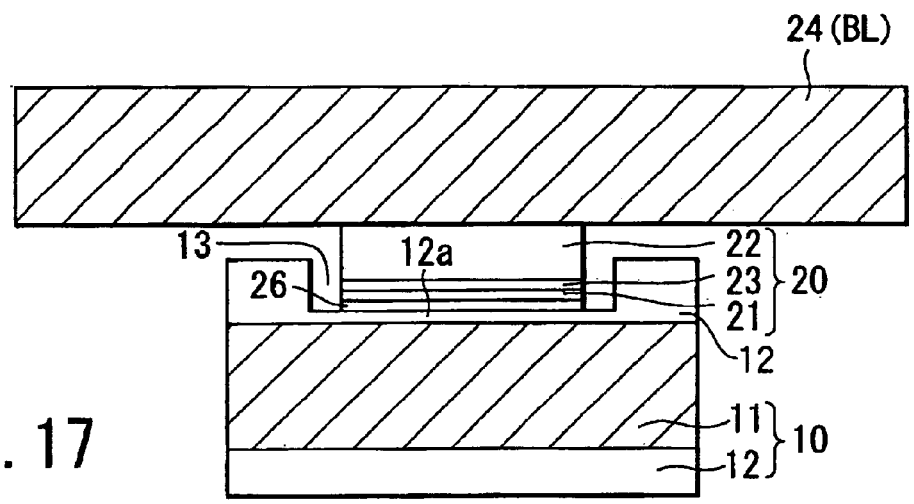
FIG. 17 is a cross-sectional view typically showing a memory cell of an MRAM device according to a third embodiment of the present invention.

FIG. 17 is a cross-sectional view typically showing a structure of an example of a memory cell used in an MRAM device according to a third embodiment of the present invention.

This memory cell is different from the memory cell according to the first embodiment in that peripheral surfaces other than both side surfaces continuous with a peripheral surface opposed to the MTJ element 20 in four peripheral surfaces of the write wiring 10 are covered with a yoke, i.e., yokes at the both side parts of the write wiring 10 are eliminated, and any other part is the same, thereby eliminating the redundant explanation.

According to such a structure, as compared with a case that the four peripheral surfaces of the write wiring 10 are covered with a yoke, the write current becomes slightly large. However, the MRAM device having such a structure is preferable when there is an enough cell array area. Moreover, the MRAM device according to the third embodiment can reduce the number of steps in manufacture.

(Fourth Embodiment)

Figure 18:
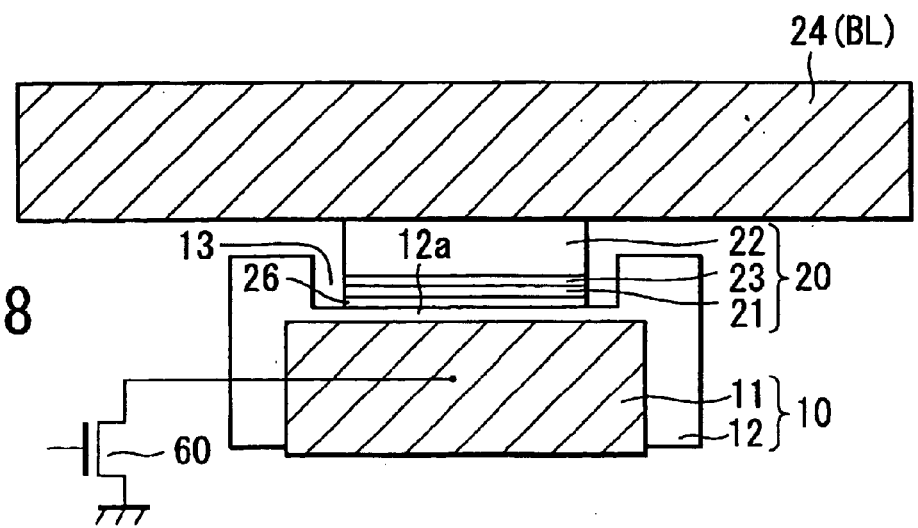
FIG. 18 is a cross-sectional view typically showing a memory cell of an MRAM device according to a fourth embodiment of the present invention.

FIG. 18 is a cross-sectional view typically showing a structure of an example of a memory cell used in an MRAM device according to a fourth embodiment of the present invention.

This memory cell is different from the memory cell according to the first embodiment in that a write cell selection transistor 60 is connected to the write wiring 10, and any other part is the same, thereby eliminating the redundant explanation.

Selection of the write cell and separation from any other cell can be carried out by connecting the write cell selection transistor 60 to the write wiring 10 as described above and controlling the transistor 60 to be switched in accordance with a control signal. In this case, as described above, since the write current can be set to a sub mA, a size of the write cell selection transistor 60 can be reduced as small as that of the MTJ element 20, and the transistor 60 can be also integrated in the memory cell array.

According to such a structure, erroneous writing can be completely eliminated. Moreover, it is possible to adopt a heat assist recording mode which performs writing while heating the recording layer 21 of a selected cell by using a write current or the like in writing. As a result, a size of the MTJ element 20 can be refined to 50 nm order, and the MRAM device according to the fourth embodiment can be substituted for a DRAM device in a system in which the DRAM device is incorporated as a memory.

On the contrary, since a concept of the conventional heat assist recording mode does not have the selectivity of cells in writing, a certain degree of heat is applied to cells other than the selected one, which is a factor provoking magnetization reversion of the recording layer due to the thermal disturbance.

It is to be noted that a description of the MRAM device according to the fourth embodiment has been given as to the case that the write cell selection transistor 60 is provided to the memory cell in the MRAM device according to the first embodiment depicted in FIG. 16, but the write cell selection transistor 60 can be likewise provided to the MRAM device according to the second or third embodiment.

Moreover, although a description has been given as to the case that the recording layer 21 of the MTJ element 20 is a single magnetic layer in each of the foregoing embodiments, the recording layer 21 may be a layer obtained by laminating multiple magnetic layers.

The MRAM device according to the first to fourth embodiments can be applied in many ways. Some of such application examples will now be described hereinafter.

APPLICATION EXAMPLE 1

Figure 19:
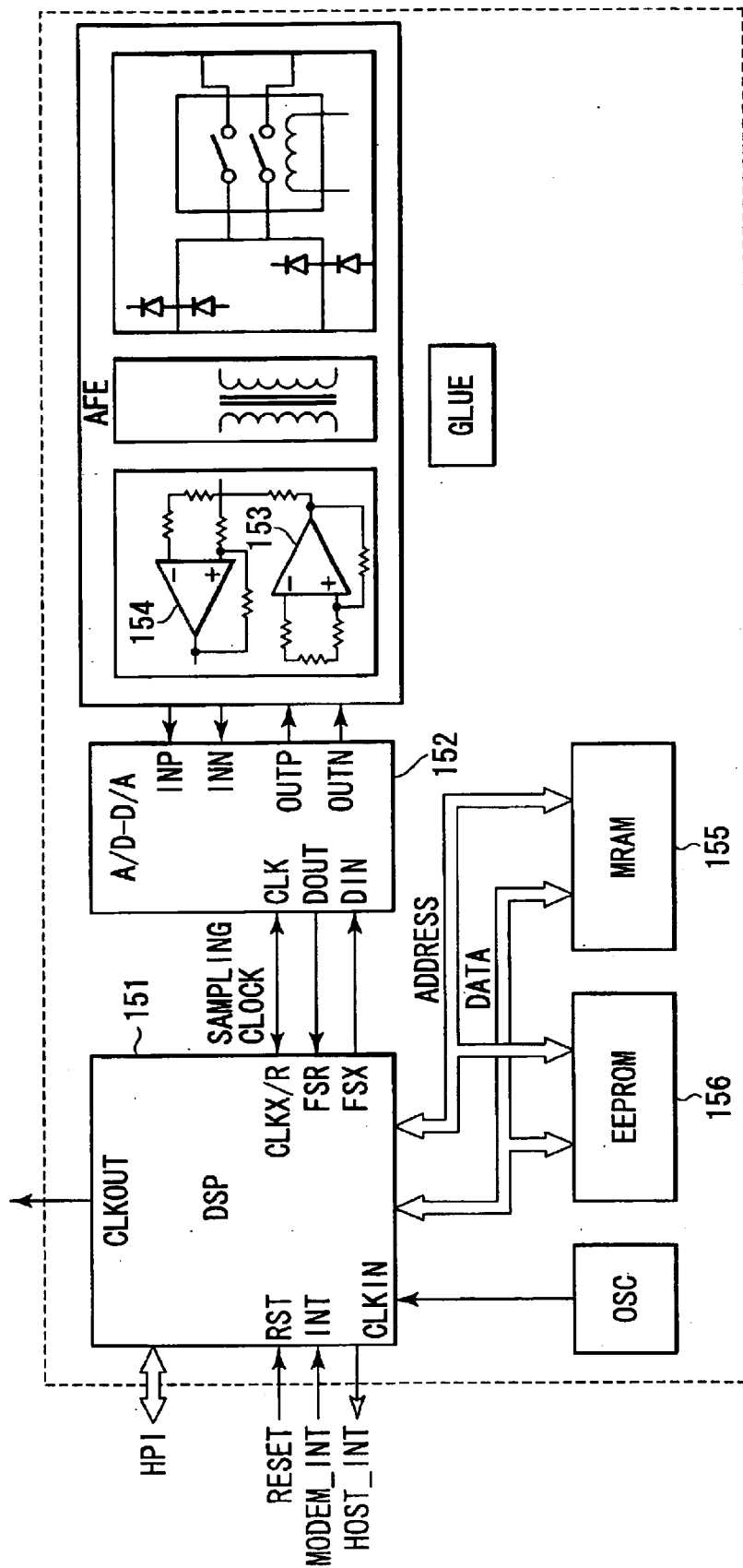
FIG. 19 is a block diagram showing a DLS data path part of a digital subscriber line modem as an application example 1 of the MRAM device.

As one of application examples of the MRAM device, FIG. 19 shows a DSL data path part of a digital subscriber line (DSL) modem. This modem includes a programmable digital signal processor (DSP) 151, an analog to digital converter (ADC) and a digital to analog converter (DAC) 152, a transmission driver 153, and a receiver amplifier 154. In FIG. 19, a band pass filter is eliminated, an MRAM 155 according to the present invention and an EEPROM 156 are shown as various kinds of optional memories which can hold a line code program instead of the band pass filter.

It is to be noted that this application example uses two types of memories, i.e., the MRAM and the EEPROM as memories used to hold a line code program, but the EEPROM may be substituted by the MRAM. That is, only the MRAM may be used without using the two types of memories.

APPLICATION EXAMPLE 2

Figure 20:
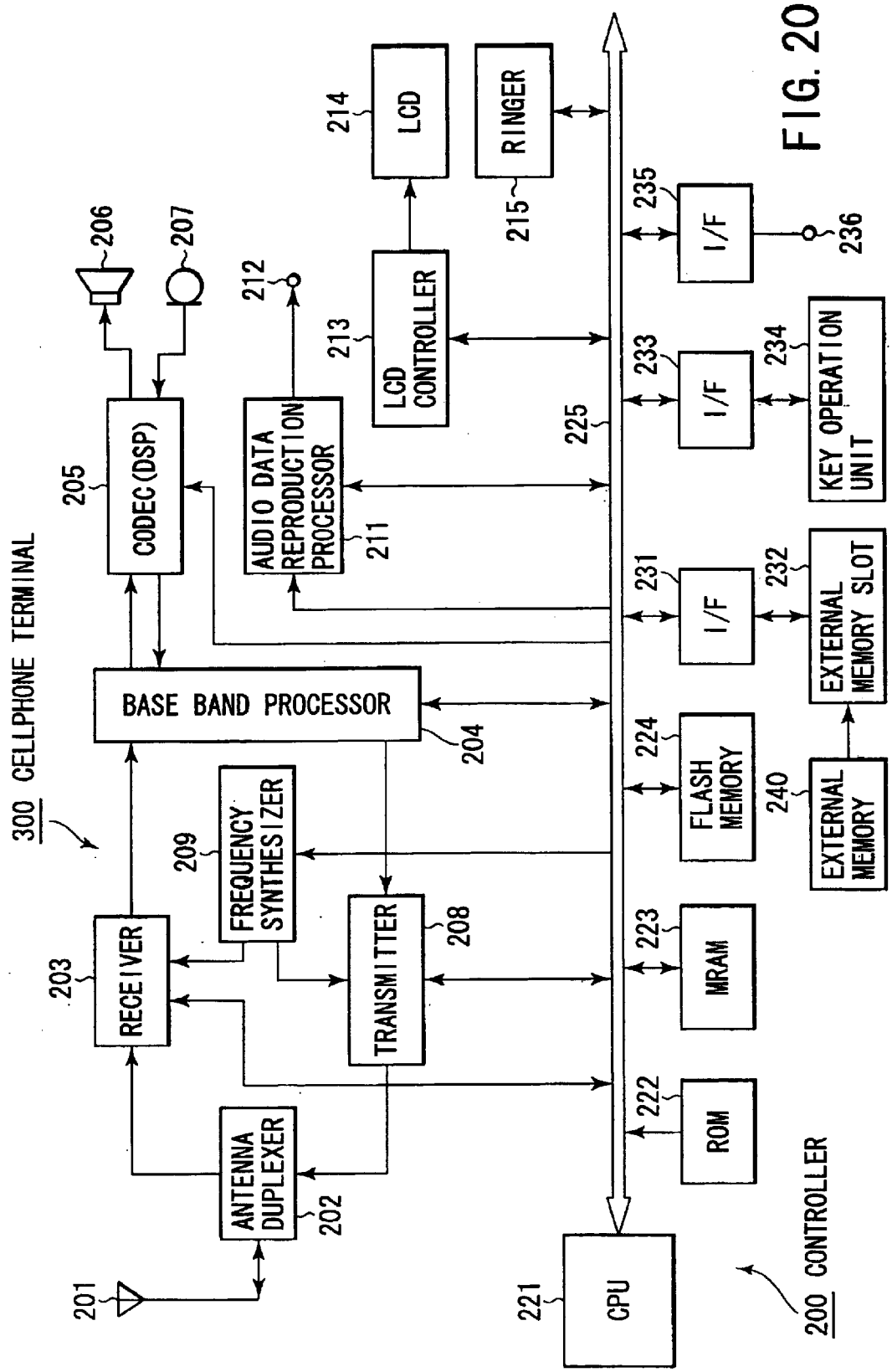
FIG. 20 is a block diagram showing a part which realizes a communication function in a cellphone terminal as an application example 2 of the MRAM device.

As another application example of the MRAM device, FIG. 20 shows a part in a cellphone terminal 300 which realizes a communication function. As shown in FIG. 30, the part which realizes the communication function includes a transmission/reception antenna 201, an antenna duplexer 202, a receiver 203, a base band processor 204, a Digital Signal Processor (DSP) 205 uses as an audio codec, a speaker 206, a microphone 207, a transmitter 208, and a frequency synthesizer 209.

Moreover, as shown in FIG. 20, to the cellphone terminal 300 is provided a controller 200 which controls each portion in the cellphone terminal. The controller 200 is a microcomputer in which a CPU 221, a ROM 222, an MRAM 223 according to the present invention and a flash memory 224 are connected through a CPU bus 225.

Here, the ROM 222 previously stores a program executed by the CPU 221 or required data such as fonts for display. Additionally, the MRAM 223 is mainly used as a working area, and it is used when storing data in the middle of calculation according to needs in execution of a program by the CPU 221 or when temporarily storing data transmitted/received with each portion. Further, the flash memory 224 stores immediately preceding setting conditions or the like even if a power supply of the cellphone terminal 300 is turned off, and stores setting parameters in case of adopting a usage that the same settings are employed at the time of turning on the power supply next time. That is, the flash memory 224 is a non-volatile memory in which data stored therein is not eliminated even if the power supply of the cellphone terminal is turned off.

In this application example, although the ROM 222, the MRAM 223 and the flash memory 224 are used, the flash memory 224 may be substituted by the MRAM according to the present invention. Furthermore, the ROM 222 can be also substituted by the MRAM according to the present invention.

It is to be noted that, in FIG. 20, reference numeral 211 denotes an audio data reproduction processor; 212, an external terminal connected to the audio data reproduction processor 211; 213, an LCD controller; 214, an LCD connected to the LCD controller 213; 215, a ringer; 231, an interface provided between the CPU bus 225 and an external memory slot 232, 233, an interface provided between the CPU bus 225 and a key operation unit 234; and 235, an interface between the CPU bus 225 and the external terminal 236. An external memory 240 is inserted into the external memory slot 232.

APPLICATION EXAMPLE 3

FIGS. 21 to 25 show examples that the MRAM device according to the present invention is applied to a card (MRAM card) that embodies a removable media such as a Smart Media card.

Figure 21:
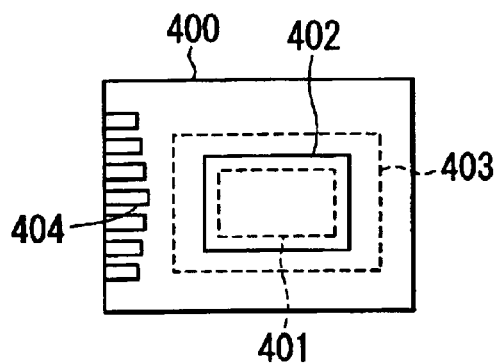
FIG. 21 is a top view showing an example that the MRAM device is applied to an MRAM card.

In a top view of FIG. 21, reference numeral 400 designates an MRAM card main body; 401, an MRAM chip; 402, an opening portion; 403, a shutter; and 404, a plurality of external terminals. An MRAM chip 401 is accommodated in the card main body 400 and exposed to the outside from the opening portion 402. When carrying the MRAM card, the MRAM chip 401 is covered with the shutter 403. The shutter 403 is constituted by a material having an effect to block off an external magnetic field, e.g., ceramics or the like. In case of transferring data, the shutter 403 is opened, and the MRAM chip 401 is exposed. The external terminal 404 is used to fetch content data stored in the MRAM card to the outside.

Figure 22:
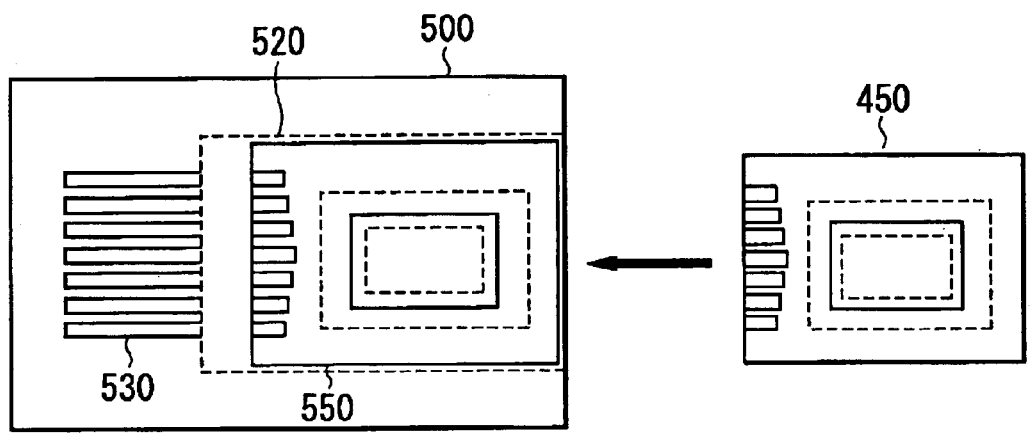
FIG. 22 is a top view showing an insertion type data transfer device as an example of an electronic device which uses the MRAM card.
Figure 23:
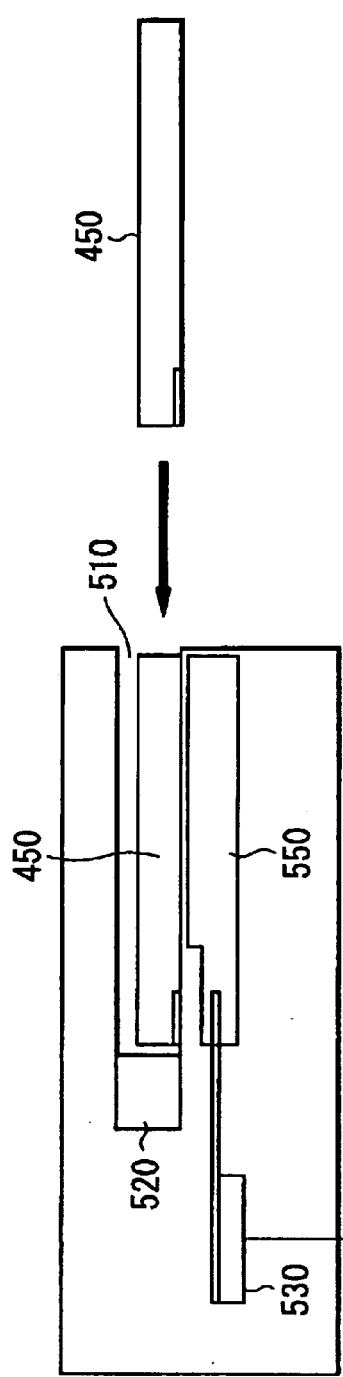
FIG. 23 is a cross-sectional view corresponding to FIG. 22.

FIGS. 22 and 23 are a top view and a side view of a card insertion type transfer device used to transfer data to the MRAM card. A second MRAM card 450 used by an end user is inserted from an insertion portion 510 of the transfer device 500 and pushed until the card stops at a stopper 520. The stopper 520 is also used as a member to position a first MRAM card 550 and the second MRAM card 450. With the second MRAM card 450 being arranged at a predetermined position, data stored in the first MRAM card 550 is transferred to the second MRAM card 450.

Figure 24:
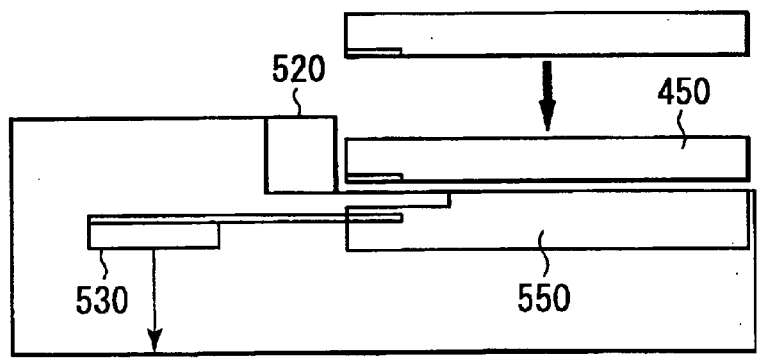
FIG. 24 is a cross-sectional view showing a fitting type data transfer device as another example of the electronic device.

FIG. 24 is a side view of a fitting type transfer device. As indicated by an arrow in the drawing, this device is of a type which mounts the second MRAM card 450 on the first MRAM card 550 so as to be fitted in with the stopper 520 being used as a target. The transfer method is the same as that of the card insertion type, thereby eliminating its explanation.

Figure 25:
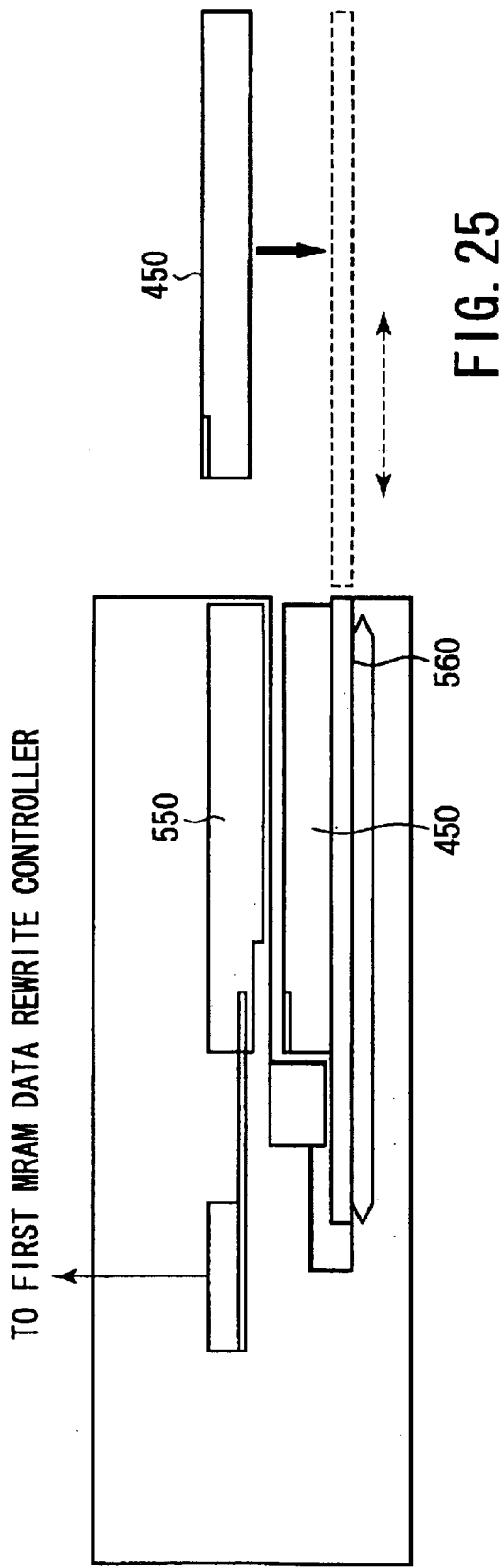
FIG. 25 is a cross-sectional view showing a slide type data transfer device as still another example of the electronic device.

FIG. 25 is a side view of a slide type transfer device. Like a CD-ROM drive, a DVD drive and others, a sliding tray 560 is provided in the transfer device 500, and the sliding tray 560 slides as indicated by an arrow in the horizontal direction in the drawing. When the sliding tray 560 has moved to a state indicated by a broken line in the drawing, the second MRAM card 450 is mounted on the sliding tray 560. Thereafter, the sliding tray 560 carries the second MRAM card 450 into the transfer device 500. Since the point that the second MRAM card 450 is carried in such a manner that an end portion of this card is brought into contact with the stopper 520 and the transfer method are the same as those of the card insertion type, their explanation is eliminated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A magnetic random access memory device comprising:
    a magnetoresistive element which stores data in accordance with a size of a resistance value between first and second magnetic layers which varies in accordance with magnetization arrangement states of the first and second magnetic layers, a non-magnetic layer being sandwiched between the first and second magnetic layers;
    a write wiring which is arranged in the vicinity of the first magnetic layer, generates an induced magnetic flux when a write current is caused to flow therethrough, and writes data in the magnetoresistive element by changing a magnetization direction in the first magnetic layer when the induced magnetic flux is applied to the magnetoresistive element; and
    a third magnetic layer which is provided so as to cover at least a peripheral surface including a first part of the write wiring opposed to the first magnetic layer of peripheral surfaces of the write wiring,
    wherein the first magnetic layer has a crystal magnetic anisotropy exceeding $10^4$ erg/cc and the first magnetic layer is exchange-coupled with the third magnetic layer, and
    a sum of a magnetic volume of a second part of the third magnetic layer opposed to the first part of the write wiring and that of the first magnetic layer is smaller than a magnetic volume of the third magnetic layer at parts other than the second part.

2. A magnetic random access memory device according to claim 1, further comprising a ruthenium film provided between the first magnetic layer and the second part of the third magnetic layer opposed to the first magnetic layer.

3. A magnetic random access memory device according to claim 1, wherein a ratio of a sum of a magnetic volume of the second part of the third magnetic layer and that of the first magnetic layer relative to a magnetic volume of the third magnetic layer at parts other than the second part is not more than 0.9.

4. A magnetic random access memory device according to claim 3, wherein a ratio of a sum of a magnetic volume of the second part of the third magnetic layer and that of the first magnetic layer relative to a magnetic volume of the third magnetic layer at parts other than the second part is not more than 0.3.

5. A magnetic random access memory device according to claim 1, wherein the exchange coupling is of a ferro type.

6. A magnetic random access memory device according to claim 1, wherein the exchange coupling is of an anti-ferro type.

7. A magnetic random access memory device according to claim 1, wherein the exchange coupling is substantially 90-degree coupling.

8. A magnetic random access memory device according to claim 1, wherein the third magnetic layer has a larger magnetic permeability than that of the first magnetic layer.

9. A magnetic random access memory device according to claim 1, wherein the third magnetic layer has a higher saturation magnetic flux density than that of the first magnetic layer.

10. A magnetic random access memory device according to claim 1, wherein a thickness of the second part of the third magnetic layer is smaller than a thickness of any other part of the third magnetic layer.

11. A magnetic random access memory device according to claim 1, wherein the first magnetic layer is composed of a magnetic layer having a multilayer structure.

12. A magnetic random access memory device according to claim 1, further comprising a write cell selection transistor which is connected to the write wiring, and heats the first magnetic layer by using the write current caused to flow through the write wiring at the time of writing data into the magnetoresistive element, thereby writing the data.

13. A magnetic random access memory device comprising:
    a magnetoresistive element which stores data in accordance with a size of a resistance value between first and second magnetic layers which varies in response to magnetization states of the first and second magnetic layers, a non-magnetic layer being sandwiched between the first and second magnetic layers, the first magnetic layer having a crystal magnetic anisotropy exceeding $10^4$ erg/cc;
    a write wiring which is arranged in the vicinity of the first magnetic layer, generates an inducted magnetic flux when a write current is caused to flow therethrough, and writes data into the magnetoresistive element by changing a magnetization direction in the first magnetic layer when the induced magnetic flux is applied to the magnetoresistive element; and
    a third magnetic layer which is provided so as to cover a peripheral surface of the write wiring opposed to the first magnetic layer, and has a concave portion in which at least the first magnetic layer of the magnetoresistive element is arranged.

14. A magnetic random access memory device according to claim 13, further comprising a ruthenium film which is provided between the first magnetic layer and a bottom surface of the concave portion of the third magnetic layer opposed to the first magnetic layer, an intensity of exchange coupling between of the first magnetic layer and the third magnetic layer being controlled by a thickness of the ruthenium film.

* * * * *